United States Patent
Kushnarenko

(10) Patent No.: US 6,611,456 B2
(45) Date of Patent: Aug. 26, 2003

(54) METHOD AND APPARATUS FOR REDUCING THE NUMBER OF PROGRAMMED BITS IN A MEMORY ARRAY

(75) Inventor: Alexander Kushnarenko, Haifa (IL)

(73) Assignee: Tower Semiconductor, Ltd., Migdal Haemek (IL)

( * ) Notice: Subject to any disclaimer, the term of this patent is extended or adjusted under 35 U.S.C. 154(b) by 0 days.

(21) Appl. No.: 09/898,725

(22) Filed: Jul. 3, 2001

(65) Prior Publication Data

US 2003/0046481 A1 Mar. 6, 2003

(51) Int. Cl.⁷ ............................................. G11C 16/04
(52) U.S. Cl. .............................. 365/185.01; 365/185.14
(58) Field of Search ....................... 365/185.01, 185.14, 365/185.28; 711/103

(56) References Cited

U.S. PATENT DOCUMENTS 6,073,208 A * 6/2000 Norman ...................... 711/103

* cited by examiner

*Primary Examiner*—Vu A. Le
(74) *Attorney, Agent, or Firm*—E. Eric Hoffman; Bever, Hoffman & Harms, LLP

(57) ABSTRACT

A memory system that reduces the number of memory cells programmed in a memory array is provided. A logic comparator determines whether more than half of the bits of a write data word require a program operation. If so, the logic comparator provides a status signal having a first state. A status signal having the first state causes the inverse of the write data word to be written to the memory array, along with the status signal. If the status signal does not have the first state, the write data word is written to the memory array, along with the status signal. During a read operation, a data word and corresponding status signal are read from the array. If the status signal has the first state, the inverse of the data word is provided as a read data word. Otherwise, the data word is provided as the read data word.

21 Claims, 5 Drawing Sheets

METHOD AND APPARATUS FOR REDUCING THE NUMBER OF PROGRAMMED BITS IN A MEMORY ARRAY

FIELD OF THE INVENTION

The present invention relates to a data interface for a memory array. More specifically, the present invention relates to transformation logic to enable data to be efficiently written to and then read from a memory array.

DESCRIPTION OF RELATED ART

Non-volatile memory arrays are typically operated as follows. Initially, all of the memory cells of the array are erased. In the case of a non-volatile memory array, this means that all of the non-volatile memory cells in the array have a low threshold voltage, or a logic "1" value. In order to store a logic "0" value in a memory cell, the memory cell must be programmed. Programming is typically performed by hot electron injection or Fowler-Nordheim tunneling. Unfortunately, programming a single non-volatile memory cell requires a significant amount of power, and stresses the memory cell. Programming more than one non-volatile memory cell requires an even larger amount of power. For a low power device, there may be a limit to the number of memory cells that can be programmed at the same time. For example, in some low power devices, only eight memory cells may be programmed at a time.

It would therefore be desirable to have a method and apparatus for decreasing the number of non-volatile memory cells that must be programmed, thereby saving power and reducing the stress applied to the memory cells.

SUMMARY

Accordingly, the present invention provides a method and apparatus for reducing the number of memory cells that must be programmed in a memory array. More specifically, the present invention uses data translation to reduce the number of memory cells that must be programmed in a memory array.

In one embodiment, a memory system includes a logic comparator coupled to receive a write data word to be stored in a memory array. The logic comparator determines whether more than half of the bits of the write data word require a program operation. In response, the logic comparator provides a status signal having a first state if more than half of the bits of the write data word must be programmed, and having a second state if half or fewer of the bits of the write data word must be programmed. The status signal is provided to an input translation circuit, which passes the write data word to the memory array as an input data word if the status signal has the second state, and passes the inverse of the write data word to the memory array as an input data word if the status signal has the first state. Then both the input data word and the corresponding status signal are written to the memory array. In one embodiment, the first state of the status signal is selected to correspond with the programmed state of a memory cell in the memory array.

An output translation block is coupled to receive a data word and the corresponding status signal read from the memory array. If the status signal read from the memory array has the second state, then the output translation block passes the data word read from the memory array without modification. If the status signal read from the memory array has the first state, then the output translation block passes the inverse of the data word read from the memory array.

In this manner, the memory system provides the proper read data values, while minimizing the number of memory cells in the memory array that must be programmed. The maximum number of memory cells that must be programmed during any write operation is reduced by half in accordance with the present invention.

The present invention will be more fully understood in view of the following description and drawings.

DETAILED DESCRIPTION

Figure 1:
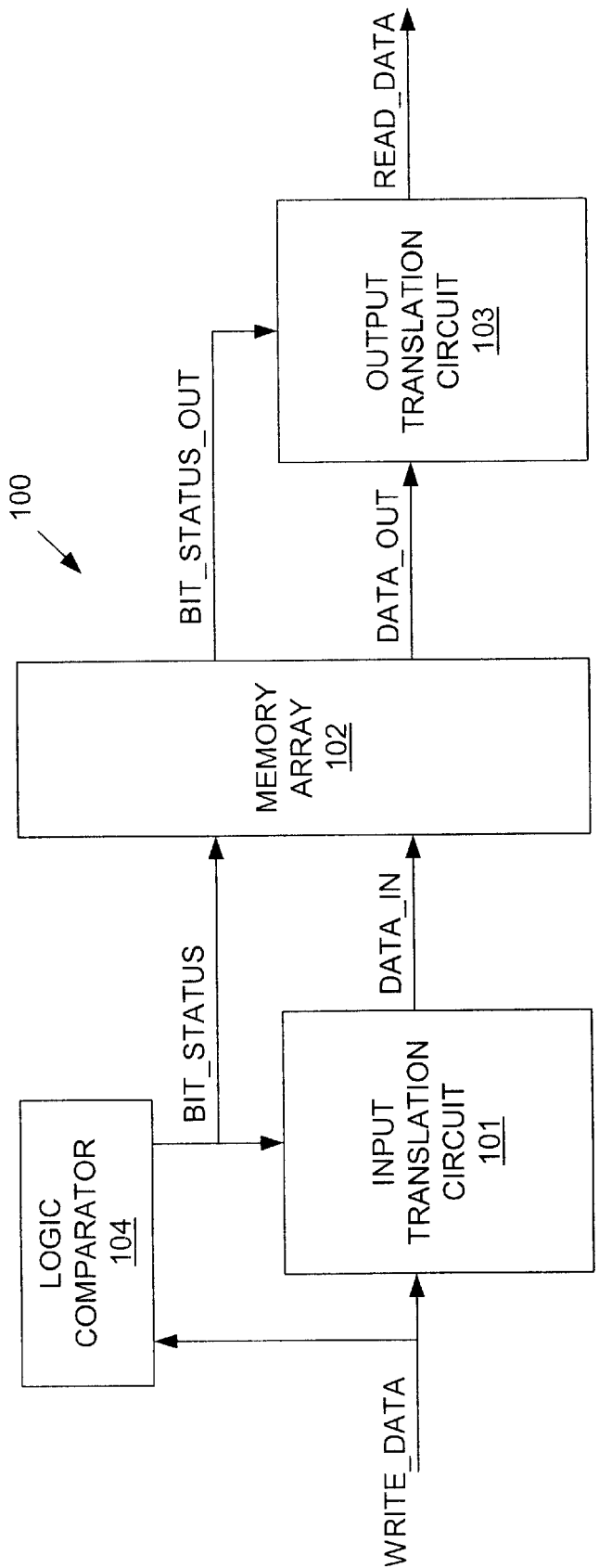
FIG. 1 is a block diagram of a memory system in accordance with the present invention.

FIG. 1 is a block diagram of a memory system 100 in accordance with one embodiment of the present invention. Memory system 100 includes input translation circuit 101, memory array 102, output translation circuit 103, and logic comparator 104.

In general, memory system 100 operates as follows. Memory array 102 includes a plurality of non-volatile memory cells that are initially erased to a logic "1"value. Programmed memory cells in memory array 102 have a logic "0" value. A write data value (WRITE_DATA) is provided to input translation circuit 101 and logic comparator 104. Logic comparator 104 determines whether more than half of the bits of the WRITE_DATA value would require the programming of memory cells in memory array 102. If more than half of the bits of the WRITE_DATA value require programming, then logic comparator 104 provides a BIT_STATUS signal having a logic "0" value. If half or fewer of the bits of the WRITE_DATA value require programming, then logic comparator 104 provides a BIT_STATUS signal having a logic "1" value. The BIT_STATUS signal is provided to both input translation circuit 101 and memory array 102.

If the BIT_STATUS signal has a logic "0" value, then it is advantageous to write the inverse of the WRITE_DATA value, rather than the WRITE_DATA value, because the inverse of the WRITE_DATA value will require fewer memory cells to be programmed in memory array 102. Thus, if the BIT_STATUS signal has a logic "0" value, then input translation circuit 101 provides the inverse of the WRITE_DATA value as the DATA_IN value to memory array 102.

If the BIT_STATUS signal has a logic "1" value, then it is advantageous to write the WRITE_DATA value, rather than the inverse of the WRITE_DATA value, because the WRITE_DATA value will require fewer memory cells to be programmed in memory array 102. Thus, if the BIT_STATUS signal has a logic "1" value, then input translation circuit 101 provides the WRITE_DATA value as the DATA_IN value to memory array 102. The DATA_IN value and the BIT_STATUS signal are written to memory array 102.

During a read operation, a data value (DATA_OUT) and the corresponding status signal (BIT_STATUS_OUT) are read from memory array 102 and provided to output translation circuit 103. If the BIT_STATUS_OUT signal has a logic "1" value, then the DATA_OUT value is routed through output translation circuit 103 as the READ_DATA value. Conversely, if the BIT_STATUS_OUT signal has a logic "0" value, then the inverse of the DATA_OUT value is routed through output translation circuit 103 as the READ_DATA value. In either case, the original WRITE_DATA value applied to memory system 100 is the same as the corresponding READ_DATA value read from memory system 100.

The operation of memory system 100 will now be described in more detail, using specific examples. In each of these examples, memory array 102 includes a plurality of non-volatile memory cells arranged in rows and columns. The non-volatile memory cells in memory array 102 are initially erased, such that these memory cells have a low threshold voltage. During a read operation, a relatively large current will flow through these erased memory cells, thereby indicating a logic "1" state. A non-volatile memory cell is programmed by hot-electron injection (or Fowler-Nordheim tunneling), whereby electrons are injected into a floating gate of the memory cell, thereby raising the threshold voltage of the memory cell. During a read operation, a relatively small current will flow through a programmed memory cell, thereby indicating a logic "0" state. In other embodiments, other types of memory cells may be used.

Figure 2:
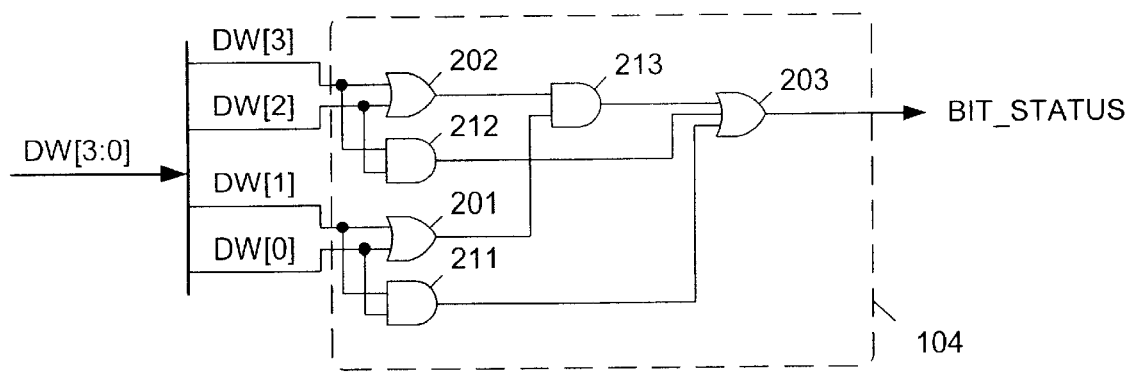
FIG. 2 is a circuit diagram of a logic comparator used in the memory system of FIG. 1 in accordance with one embodiment of the present invention.

FIG. 2 is a circuit diagram of logic comparator 104 in accordance with a first example. In this example, the WRITE_DATA value is a 4-bit data value DW[3:0]. Logic comparator 104 includes logical OR gates 201–203 and logical AND gates 211–213. The write data bits DW[3] and DW[2] are applied to input terminals of OR gate 202 and AND gate 212. The write data bits DW[1] and DW[0] are applied to input terminals of OR gate 201 and AND gate 211. The output terminals of OR gates 201–202 are coupled to input terminals of AND gate 213. The output terminals of AND gates 211–213 are applied to input terminals of OR gate 203. OR gate 203 provides the BIT_STATUS signal. The BIT_STATUS signal will have a logic "0" value if more than two of the four bits in the write data value DW[3:0] have a logic "0" value. That is, the BIT_STATUS signal will have a logic "0" value if more than half of the bits of the write data value DW[3:0] will require a programming operation in memory array 102. The BIT_STATUS signal will have a logic "1" value if half or fewer of the bits of the write data value DW[3:0] require a programming operation. Table 1 below defines the BIT_STATUS signal for the various values of the write data value DW[3:0].

TABLE 1

| DW [3:0] | BIT_STATUS |
|---|---|
| 0000 | 0 |
| 0001 | 0 |
| 0010 | 0 |
| 0011 | 1 |
| 0100 | 0 |
| 0101 | 1 |
| 0110 | 1 |
| 0111 | 1 |
| 1000 | 0 |
| 1001 | 1 |
| 1010 | 1 |
| 1011 | 1 |
| 1100 | 1 |
| 1101 | 1 |
| 1110 | 1 |
| 1111 | 1 |

In other embodiments, other logic gates can be used to implement logic comparator 104.

Figure 3:
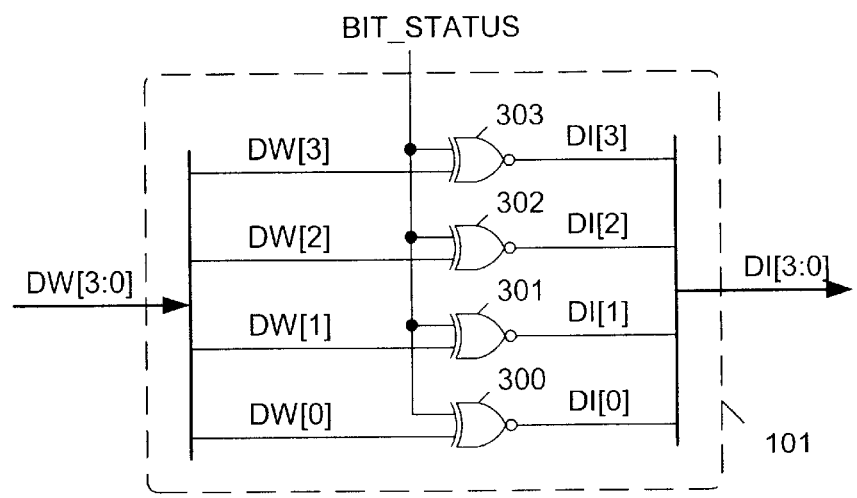
FIG. 3 is a circuit diagram of an input translation circuit used in the memory system of FIG. 1 in accordance with one embodiment of the present invention.

FIG. 3 is a circuit diagram of input translation circuit 101 in accordance with one embodiment of the first example. Input translation circuit 101 includes exclusive NOR gates 300–303. Each of exclusive NOR gates 300–303 has an input terminal coupled to receive a corresponding one of write data bits DW[3:0]. More specifically, exclusive NOR gates 300, 301, 302, and 303 are configured to receive write data bits DW[0], DW[1], DW[2] and DW[3], respectively. Each of exclusive NOR gates 300–303 also has an input terminal coupled to receive the BIT_STATUS signal generated by logic comparator 104. In response, exclusive NOR gates 300–303 provide the DATA_IN value, DI[3:0]. If the BIT_STATUS signal has a logic "1" value, then the data input value DI[3:0] will be equal to the write data value DW[3:0]. Conversely, if the BIT_STATUS signal has a logic "0" value, then the data input value DI[3:0] will be equal to the inverse of the write data value DW[3:0]. Table 2 below defines the data input value DI[3:0] for the various values of the write data value DW[3:0] and BIT_STATUS signal.

TABLE 2

| DW [3:0] | BIT_STATUS | DI [3:0] |
|---|---|---|
| 0000 | 0 | 1111 |
| 0001 | 0 | 1110 |
| 0010 | 0 | 1101 |
| 0011 | 1 | 0011 |
| 0100 | 0 | 1011 |
| 0101 | 1 | 0101 |
| 0110 | 1 | 0110 |
| 0111 | 1 | 0111 |
| 1000 | 0 | 0111 |
| 1001 | 1 | 1001 |
| 1010 | 1 | 1010 |
| 1011 | 1 | 1011 |
| 1100 | 1 | 1100 |
| 1101 | 1 | 1101 |
| 1110 | 1 | 1110 |
| 1111 | 1 | 1111 |

In other embodiments, other logic gates can be used to implement input translation circuit 101.

Figure 4:
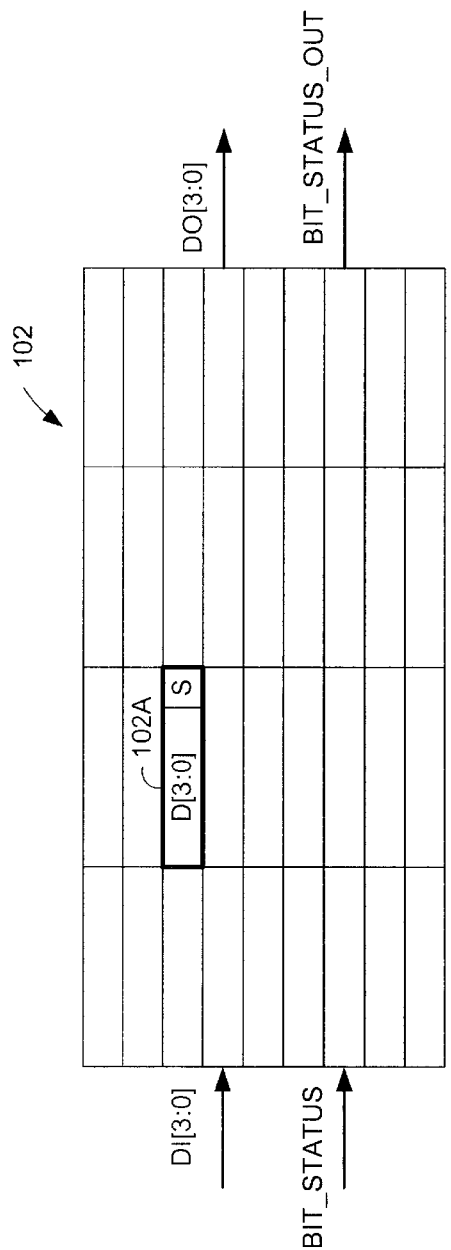
FIG. 4 is a block diagram of a memory array used in the memory system of FIG. 1 in accordance with one embodiment of the present invention.

FIG. 4 is a block diagram illustrating memory array 102, which is coupled to receive the data input value DI[3:0] and the BIT_STATUS signal. In response to a write instruction an a write address, the data input value DI[3:0] and the BIT_STATUS signal are written to entry (byte location)

102A of memory array 102 as data value D[3:0] and status bit, S. Thus, an additional bit (i.e., the status bit) must be written to memory array 102. However, the maximum number of bits that must be programmed in memory array 102 during any write operation is two bits, including the status bit S (See, Table 2). Note that this is half of the maximum number of bits (i.e., 4) that would have to be programmed during a write operation in the prior art.

The data value D[3:0] and status bit S can subsequently be read out of array 102 as the data output value DO[3:0] and output status bit, BIT_STATUS_OUT in a manner known to those of ordinary skill in the art.

Figure 5:
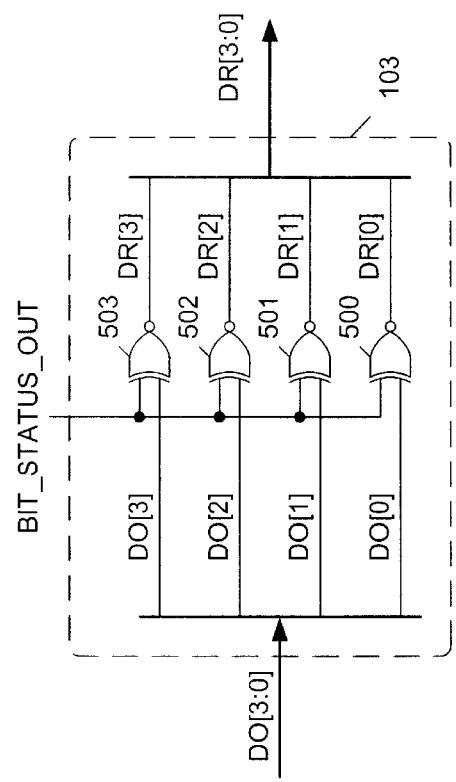
FIG. 5 is a circuit diagram of an output translation circuit used in the memory system of FIG. 1 in accordance with one embodiment of the present invention.

FIG. 5 is a circuit diagram of output translation circuit 103 in accordance with one embodiment of the present invention. In this embodiment, output translation circuit 103 includes exclusive NOR gates 500–503. Each of exclusive NOR gates 500–503 has an input terminal coupled to receive a corresponding one of the data output bits DO[3:0]. More specifically, exclusive NOR gates 500, 501, 502 and 503 are configured to receive data output bits DO[0], DO[1], DO[2] and DO[3], respectively. Each of exclusive NOR gates 500–503 also has an input terminal coupled to receive the BIT_STATUS_OUT signal read from memory array 102. In response, exclusive NOR gates 500–503 provide the read data value DR[3:0]. If the BIT_STATUS_OUT signal has a logic "1" value, then the read data value DR[3:0] will be equal to the data output value DO[3:0]. Conversely, if the BIT_STATUS_OUT signal has a logic "0" value, then the read data value DR[3:0] will be equal to the inverse of the data output value DO[3:0]. Table 3 below defines the read data value DR[3:0] for the various values of the data output value DO[3:0] and the BIT_STATUS_OUT signal.

TABLE 3

| DO [3:0] | BIT_STATUS_OUT | DR [3:0] |
|---|---|---|
| 1111 | 0 | 0000 |
| 1110 | 0 | 0001 |
| 1101 | 0 | 0010 |
| 0011 | 1 | 0011 |
| 1011 | 0 | 0100 |
| 0101 | 1 | 0101 |
| 0110 | 1 | 0110 |
| 0111 | 1 | 0111 |
| 0111 | 0 | 1000 |
| 1001 | 1 | 1001 |
| 1010 | 1 | 1010 |
| 1011 | 1 | 1011 |
| 1100 | 1 | 1100 |
| 1101 | 1 | 1101 |
| 1110 | 1 | 1110 |
| 1111 | 1 | 1111 |

Note that output translation circuit 103 restores the read data value DR[3:0] to the proper value. In other embodiments, other logic gates can be used to implement output translation circuit 103.

Figure 6:
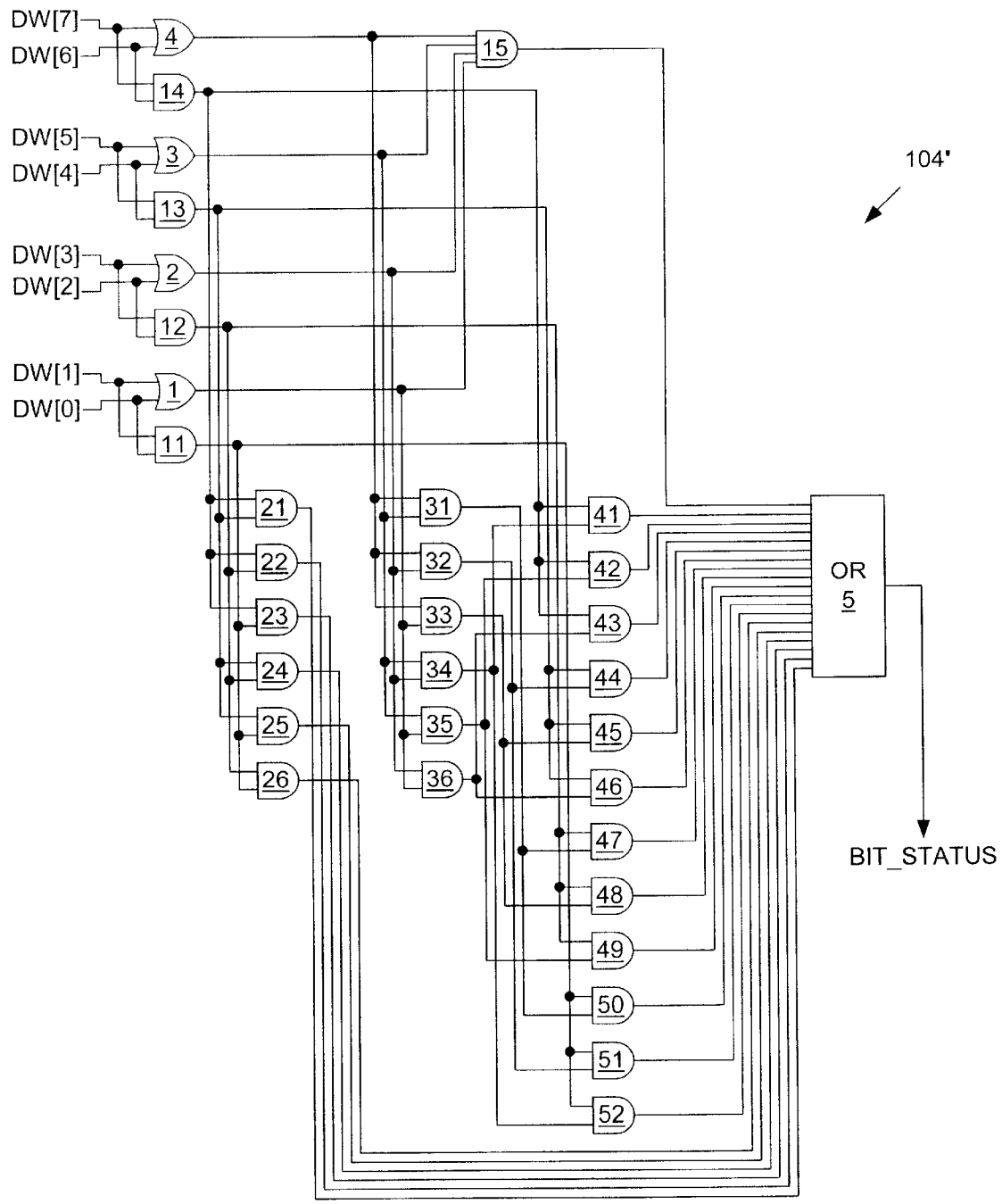
FIG. 6 is a circuit diagram of a logic comparator used in the memory system of FIG. 1 in accordance with another embodiment of the present invention.
Figure 8:
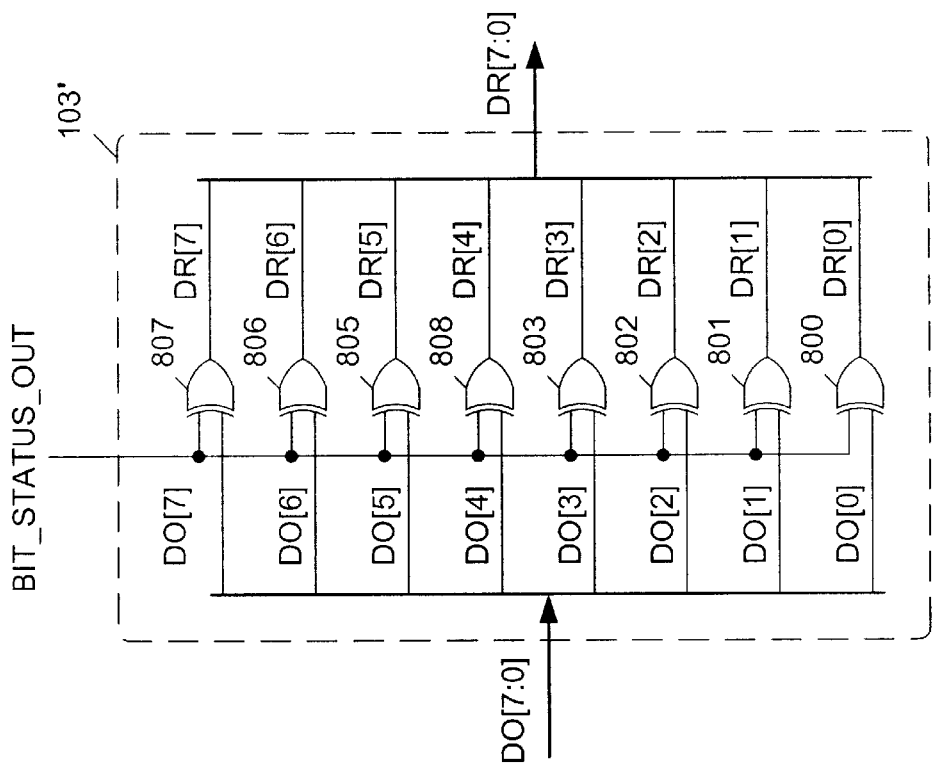
FIG. 8 is a circuit diagram of an output translation circuit used in the memory system of FIG. 1 in accordance with another embodiment of the present invention.
Figure 7:
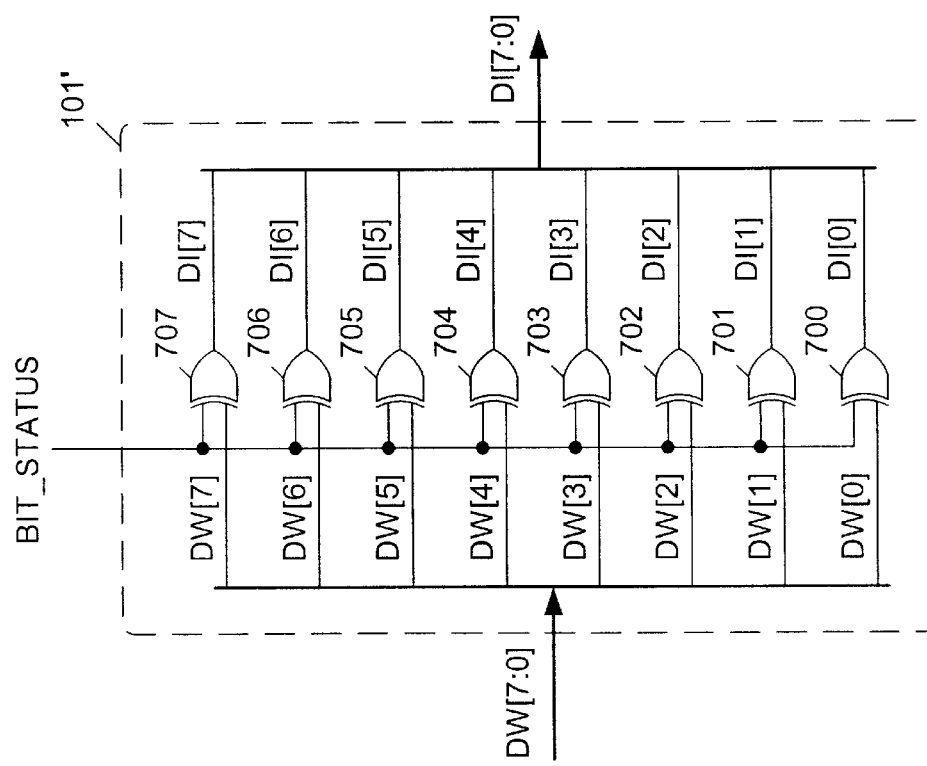
FIG. 7 is a circuit diagram of an input translation circuit used in the memory system of FIG. 1 in accordance with another embodiment of the present invention.

Although the example described above uses 4-bit data values, it is understood that data values of other widths can also be used in accordance with other embodiments of the present invention. For example, 8-bit data values can be used in another embodiment of the present invention. FIGS. 6–8 illustrate a logic comparator, an input translation circuit, and an output translation circuit, respectively, for second example that uses 8-bit data values.

FIG. 6 is a circuit diagram of a logic comparator 104' that can be used to implement logic comparator 104 (FIG. 1) when memory system 100 uses 8-bit data values. Logic comparator 104' provides a BIT_STATUS signal in response to an 8-bit write data value DW[7:0]. Logic comparator 104' includes OR gates 1–5 and AND gates 11–15, 21–26, 31–36 and 41–52. These logic gates are configured such that the BIT_STATUS signal will have a logic "0" value if more than four of the eight bits in the write data value DW[7:0] have a logic "0" value. That is, the BIT_STATUS signal will have a logic "0" value if more than half of the bits of the write data value DW[7:0] will require a programming operation. The BIT_STATUS signal will have a logic "1" value if four or more of the eight bits in the write data value DW[7:0] have a logic "1" value (i.e., half or fewer of the bits of the write data value DW[7:0] require a programming operation). The BIT_STATUS signal is applied to memory array 102 and the input translation circuit of FIG. 7.

FIG. 7 is a circuit diagram of an input translation circuit 101' that can be used to implement input translation circuit 101 (FIG. 1) when memory system uses 8-bit data values. Input translation circuit 101' includes exclusive NOR gates 700–707, which are coupled to receive write data values DW[0], DW[1], DW[2], DW[3], DW[4], DW[5], DW[6] and DW[7], respectively. Each of exclusive NOR gates 700–707 is further coupled to receive the BIT_STATUS signal provided by logic comparator 104'. Input translation circuit 101' operates in the same manner as input translation circuit 101 (FIG. 3) to provide an 8-bit input data value DI[7:0]. Thus, if the BIT_STATUS signal has a logic "0" value, then the input data value DI[7:0] is the inverse of the write data value DW[7:0]. Conversely, if the BIT_STATUS signal has a logic "1" value, then the input data value DI[7:0] is equal to the write data value DW[7:0].

The input data value DI[7:0] and the corresponding BIT_STATUS signal are written to an addressed entry of memory array 102. Advantageously, no more than four memory cells are programmed during the write operation. Subsequently, this data value and BIT_STATUS signal are read from memory array as the data output value DO[7:0] and the BIT_STATUS_OUT signal, respectively.

FIG. 8 is a circuit diagram of an output translation circuit 103' that can be used to implement the output translation circuit 103 (FIG. 1) when memory system uses 8-bit data values. Output translation circuit 103' includes exclusive NOR gates 800–807, which are coupled to receive data output values DO[0], DO[1], DO[2], DO[3], DO[4], DO[5], DO[6] and DO[7], respectively, from memory array 102. Each of exclusive NOR gates 800–807 is also coupled to receive the BIT_STATUS_OUT signal provided by memory array 102. Output translation circuit 103' operates in the same manner as output translation circuit 103 (FIG. 3) to provide 8-bit read data value DR[7:0]. Thus, if the BIT_STATUS_OUT signal has a logic "0" value, then the read data value DR[7:0] is the inverse of the data output value DO[7:0]. Conversely, if the BIT_STATUS_OUT signal has a logic "1" value, then the read data value DR[7:0] is equal to the output data value DO[7:0].

Although the present invention has been described in connection with several embodiments, it is understood that this invention is not limited to the embodiments disclosed, but is capable of various modifications, which would be apparent to a person skilled in the art. Thus, the invention is limited only by the following claims.

What is claimed is:

1. A memory system comprising:
   an array of memory cells;
   a logic comparator coupled to receive a write data value having a plurality of bits, the logic comparator being configured to provide a status signal having a first state if more than half of the bits will require memory cells in the array to be programmed, and a second state if half or fewer of the bits will require memory cells in the array to be programmed, the logic comparator providing the status signal to the array;

an input translation circuit coupled to receive the write data value and the status signal, the input translation circuit being configured to pass the inverse of the write data value to the array as a data input signal if the status signal has the first state, and to pass the write data value to the array as a data input signal if the status signal has the second state; and an output translation circuit coupled to receive a output data value and a corresponding status signal from the array, the output translation circuit being configured to pass the inverse of output data value as a read data value if the status signal has the first state, and to pass the write data value as a read data value if the status signal has the second state.

2. The memory system of claim 1, wherein the memory cells are non-volatile memory cells.

3. The memory system of claim 2, wherein the non-volatile memory cells are programmed by hot electron injection or Fowler-Nordheim tunneling.

4. The memory system of claim 1, wherein the input translation circuit comprises a plurality of exclusive NOR gates, each coupled to receive the status signal and a bit of the write data value.

5. The memory system of claim 1, wherein the output translation circuit comprises a plurality of exclusive NOR gates, each coupled to receive the corresponding status signal read from the array and a bit of the data output value.

6. The memory system of claim 1, wherein the array comprises an entry configured to store the status signal and the data input value provided to the array.

7. The memory system of claim 1, wherein the write data value is 4-bits wide.

8. The memory system of claim 1, wherein the write data value is 8-bits wide.

9. The memory system of claim 1, wherein the first state of the status signal corresponds with a programmed state of a memory cell in the array.

10. A method of operating a memory system having a memory array, the method comprising:

providing a write data value having a plurality of bits;

determining whether more than half of the bits in the write data value will require a programming operation in the memory array;

generating a status signal that has a first state when more than half of the bits in the write data value will require a programming operation in the memory array, and a second state when half or fewer of the bits in the write data value will require a programming operation in the memory array;

writing the write data value to the memory array as an input data value if the status signal has the second state; and writing the inverse of the write data value to the memory array as an input data value if the status signal has the first state.

11. The method of claim 10, further comprising writing the status signal to the memory array.

12. The method of claim 11, further comprising writing the status signal and the write data value, or the inverse of the write data value, to the same entry of the memory array.

13. The method of claim 11, further comprising:

reading the input data value and the status signal from the memory array;

providing the input data value as a read output data value if the status signal has the second state; and providing the inverse of the input data value as the read output data value if the status signal has the first state.

14. The method of claim 10, wherein the first state of the status signal corresponds with a programmed state of a memory cell in the memory array.

15. The method of claim 10, wherein writing to the memory array comprises programming one or more non-volatile memory cells.

16. The method of claim 15, wherein the programming comprises hot electron injection or Fowler-Nordheim tunneling.

17. A memory system comprising:

means for providing a write data value having a plurality of bits;

means for determining whether more than half of the bits in the write data value will require a programming operation in the memory array;

means for generating a status signal that has a first state when more than half of the bits in the write data value will require a programming operation in the memory array, and a second state when half or fewer of the bits in the write data value will require a programming operation in the memory array;

means for writing the write data value to the memory array as an input data value if the status signal has the second state; and means for writing the inverse of the write data value to the memory array as an input data value if the status signal has the first state.

18. The memory system of claim 17, further comprising means for writing the status signal to the memory array.

19. The memory system of claim 18, further comprising means for writing the status signal and the write data value, or the inverse of the write data value, to the same entry of the memory array.

20. The memory system of claim 17, wherein the first state of the status signal corresponds with a programmed state of a memory cell in the memory array.

21. The memory system of claim 17 further comprising:

means for reading the input data value and the status signal from the memory array;

means for providing the input data value as a read output data value if the status signal has the second state; and means for providing the inverse of the input data value as the read output data value if the status signal has the first state.

* * * * *